United States Patent [19]

Bell

[11] Patent Number: 5,640,119
[45] Date of Patent: Jun. 17, 1997

[54] METHOD AND APPARATUS PROVIDING HIGH SPEED VIDEO SIGNAL LIMITING

[75] Inventor: Isaac Michael Bell, Indianapolis, Ind.

[73] Assignee: Thomson Consumer Electronics, Inc., Indianapolis, Ind.

[21] Appl. No.: 731,723

[22] Filed: Oct. 17, 1996

Related U.S. Application Data

[63] Continuation of Ser. No. 366,794, Dec. 30, 1994, abandoned.

[51] Int. Cl.⁶ ........................................... H03K 5/08
[52] U.S. Cl. ...................... 327/309; 327/313; 327/321
[58] Field of Search ............................ 327/309, 312, 327/318, 180, 403, 405, 310, 311, 313–317, 319–330

[56] References Cited

U.S. PATENT DOCUMENTS

| | | | |
|---|---|---|---|
| 3,514,637 | 5/1970 | Herrmann | 327/405 |
| 3,555,300 | 1/1971 | Overlie | 327/309 |
| 3,560,770 | 2/1971 | Gieles | 326/32 |
| 3,946,209 | 3/1976 | Jekat | 327/309 |
| 3,949,317 | 4/1976 | Crosby | 330/30 D |
| 4,384,302 | 5/1983 | Schwarz | 358/27 |
| 4,626,707 | 12/1986 | Arita et al. | 327/407 |
| 4,933,646 | 6/1990 | Sauer | 330/277 |

*Primary Examiner*—Timothy P. Callahan
*Assistant Examiner*—Kenneth B. Wells
*Attorney, Agent, or Firm*—Joseph S. Tripoli; Peter M. Emanuel; Richard G. Coalter

[57] ABSTRACT

An input signal (IN) and a threshold signal (Vt) are coupled to an output terminal (2) via the base-emitter paths of first (Q1) and second (Q2) transistors having respective collector electrodes connected to a supply voltage source (3). The output terminal (2) is coupled to a source of reference potential (4) via a first resistor (Re) and is coupled via a second resistor (Rd) to a selected plate of a capacitor (C1) that is connected between the collector and base electrodes of the second transistor (Q2). Circuit impedances are scaled such that Re>Rd>R1 wherein Re and Rd are the values of the first and second resistors, respectively, and R1 is a component of the output impedance of the threshold signal source (5).

10 Claims, 1 Drawing Sheet

METHOD AND APPARATUS PROVIDING HIGH SPEED VIDEO SIGNAL LIMITING

The is a continuation of application Ser. No. 08/366,794 filed Dec. 30, 1994, now abandoned.

FIELD OF THE INVENTION

This invention relates to limiters and particularly to high speed limiters suitable for use with wideband (i.e. video) signal sources.

BACKGROUND OF THE INVENTION

Precise limiting of fast rise-time narrow (e.g., less than 100 nano-Second) pulses of relatively low amplitude (e.g., <1 volt) presents a technical challenge. It is especially true when the available hardware is limited by cost, board area or other construction considerations. The conventional limiters using diode, or Zener diode, junction or saturation characteristics of a transistor either do not work at all in the case of very narrow and small amplitude pulses (e.g., 100 n-Second, 1 volt) or do not guarantee acceptable performance. Such pulses are commonly encountered, for example, in video signal processing circuits.

As an example, it is common practice to apply peaking to luminance signals for improving the apparent sharpness of image edges. Certain types of peaking circuits, however, create overshoots which are acceptable at most video signal levels but which may exceed 100 IRE levels for signals at or near peak white. Exceeding the peak white levels may, in turn, lead to undesired saturation or "blooming" effects and so it would be desirable to limit or "clip" overshoots exceeding peak white levels. A particular problem in limiting pulses of short duration and relatively low amplitude is delayed response. Other applications in which fast pulse limiting action would be desirable include noise limiters in communications equipment, input signal conditioners in analog to digital converters and so forth.

SUMMARY OF THE INVENTION

The present invention is directed to meeting the need for a limiter suitable for general signal limiting applications and particularly well suited for applications, such as video signal processing, for limiting relatively fast pulses (e.g., in the nano-Second region) which may be of relatively low amplitude (e.g., in the milli-Volt region).

A method, in accordance with the invention, for limiting an input signal, comprises coupling the input signal to an output terminal via the base emitter path of a first transistor; coupling a threshold signal to the output terminal via the base emitter path of a second transistor; applying a supply voltage to the collector electrodes of the first and second transistors; coupling the output terminal to a source of reference potential via a first resistor and to a selected one of the base and collector electrodes of the second transistor via a second resistor; and coupling a capacitor between the base and collector electrodes of said second transistor.

Pulse limiting apparatus, embodying the invention, comprises first and second bipolar transistors having collector electrodes connected to a supply terminal and having emitter electrodes connected to an output terminal which is coupled to a source of reference potential via an emitter resistor, Re. A threshold voltage source, having a predetermined output impedance, Ro, is connected to the base of the second one of the transistors, the base of the first of the transistors being coupled to a source of input signal to be limited. A capacitor is coupled between the collector and base electrodes of the second transistor the emitter of which is coupled to a given one of its base and collector electrodes via a further resistor, Rd.

In accordance with a further feature of the invention, the emitter resistor Re, the further resistor Rd and the output impedance Ro of the threshold voltage source are scaled such that Re>Rd and Rd>Ro.

BRIEF DESCRIPTION OF THE DRAWINGS

The foregoing and further features of the invention are shown in the accompanying drawing wherein.

DETAILED DESCRIPTION

Figure 1:
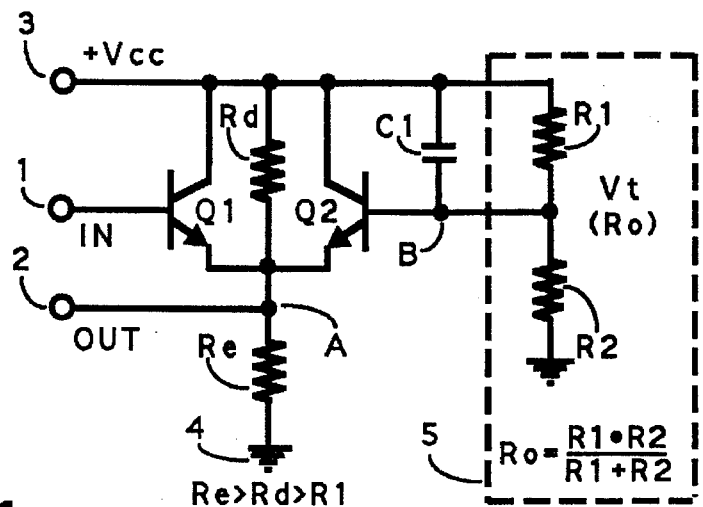
FIG. 1 is a detailed schematic diagram of a first embodiment of the invention.

The limiter circuit of FIG. 1 comprises first and second bipolar transistors, Q1 and Q2 having collector electrodes connected to a supply terminal 3 for receiving a source of supply voltage (+Vcc), having emitter electrodes commonly connected at circuit node "A" to an output terminal 2 and coupled to a source of reference potential 4 (ground) via a first resistor Re. A threshold voltage source 5 is connected at circuit node "B" to the base of the second transistor Q2. A capacitor C1 is coupled between the collector and base electrodes of the second transistor Q2 and a second resistor Rd is coupled between the emitter and collector electrodes of the second transistor In a subsequent embodiment of the invention, the second resistor Rd is connected between the base and collector electrodes of the second transistor.

The threshold signal source 5 (outlined in phantom) comprises a third resistor R1 coupled between the base electrode of the second transistor Q2 and the supply terminal 3 and a fourth resistor R3 coupled between the base electrode of the second transistor Q2 and the source of ground potential 4. Resistors R3 and R4, thus connected form a potential divider for developing the threshold voltage Vt for the limiter.

It is desirable for optimum compensation for delay of transistor Q2 that the source resistance for the base of transistor Q2 from the collector supply Vcc be less than the value of resistor Rd which, in turn, is selected to be less than the value of resistor Re. Stated in mathematical terms, Re>Rd>R1 A useful approximation is to select the Thevenin equivalent impedance of source 5 to be less than the value of resistor Rd. The equivalent impedance or "output" impedance of source 5 is given by the relationship Ro=(R1)(R2)/(R1+R2). Using this relationship, Ro is selected to be less than Rd which is selected to be less than Re. Desirably, the value of capacitor C1 is selected to be substantially greater than the total capacitance including stray capacitances (not shown) between the base and emitter electrodes of the second transistor Q2.

In the foregoing description, terminals 1 and 2 and transistor Q1 form a first circuit path which provides the function of coupling the input signal IN to the output terminal 2 via the base emitter path of the first transistor Q1. The connections of the output terminal 2, the threshold source 5 and the transistor Q2 form a second circuit path which provides the function of coupling the threshold signal Vt to the output terminal 2 via the base emitter path of the second transistor Q2. The connections of supply terminal 3 and transistors Q1 and Q2 form a third circuit path which provides the function of applying the supply voltage Vcc to the collector electrodes of the first and second transistors. The connections of the output terminal 2 and first and second resistors Re and Rd form a fourth circuit path that provides the function of coupling the output terminal to the source of reference potential via the first resistor and to a selected one of the base and collector electrodes of the second transistor via the second resistor. In this example, the selected electrode is the collector electrode. Lastly, the connections of capacitor C1 and transistor Q2 form a fifth circuit path providing the function of coupling the capacitor between the base and collector electrodes of the second transistor. As noted above, it is desirable that the second and fourth circuit path element values are selected to exhibit an impedance inequality in which Re>Rd>R1 wherein Re and Rd are the values of the first and second resistors, respectively, and R1 is the source impedance for the base of transistor Q2 from the supply Vcc. A useful approximation is Re>Rd>Ro wherein Ro is the output impedance of the threshold signal source.

As previously discussed, the main problem in limiting small fast pulses is one of limiter delay. It is herein recognized that in the example of FIG. 1 the principal source of delay is due mainly to the input capacitance of the second transistor Q2. This transistor has to be charged through the emitter resistor Re and the threshold source impedance R1. Consequently, the feedback voltage applied to the emitter of transistor Q1 is delayed with respect to the input signal voltage IN by the time to charge the base-emitter capacitance of the transistor Q2 and any stray capacitances associated therewith. If resistor Rd and capacitor C1 were not present in the circuit, this charging delay would cause the input pulse to be cut-off not flat, but slashed. Moreover, in the absence of Rd and C1, in the case of very narrow pulses the cut never even reaches the predetermined threshold voltage Vt of source 5.

To speed up the response the output impedance of source 5 is bypassed by capacitor C1 and resistor Rd provides current to circuit node "A" which provides what will herein be called "preliminary" clipping. The level of this preliminary clipping is controlled by selecting resistors Rd and Re to produce a voltage at node A at a level a little bit lower than the needed threshold (i.e., less than Vt minus Vbe of Q2).

Finally, it has been found very desirable in achieving maximum response speed if the resistance values are scaled as previously described to satisfy the inequality Re>Rd>R1 or, at the least Re>Rd>Ro. Exemplary values are: 15 k-Ohms for resistor Re, 9.1 k-Ohms for resistor Rd, and 200 Ohms for R1 and about 1000 pico-Farads for capacitor C1. Other suitable values may, of course, be selected in a specific application to satisfy specific requirements of supply voltage, circuit power dissipation, threshold voltage requirements and so forth. The value of the capacitor C1, desirably, is selected to be substantially greater than the total capacitance between the base and emitter electrodes of the second transistor Q2. The exemplary value noted above is more than an order of magnitude greater than the base emitter capacitance and stray capacitance associated with transistor Q2.

Figure 2:
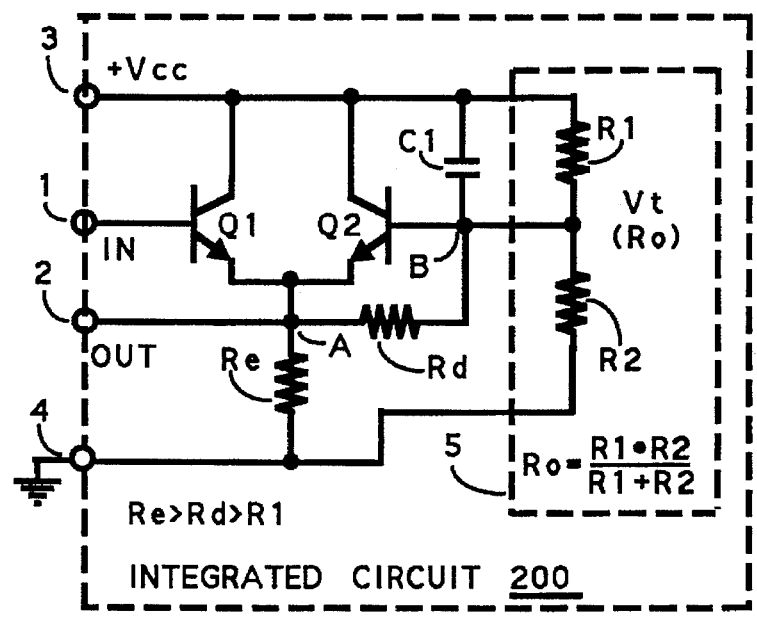
FIG. 2 is a detailed schematic diagram of a second embodiment of the invention.

The example of FIG. 1 may be modified as shown in FIG. 2 to provide improved precision. In FIG. 2 the resistor Rd is coupled between the emitter and base electrodes of the second transistor Q2 and the entire circuit has been formed in an integrated circuit 200. Integration provides close matching of transistor threshold voltages and resistor tolerances and values as well as improved reliability.

Other changes may be made in the embodiments herein described. For example, in the discrete version of the limiter of FIG. 1 the threshold voltage source may be replaced by a potentiometer to facilitate precise adjustment of the threshold voltage Vt. The same change could be don in the integrated circuit version of FIG. 2 by making circuit node B available for external connection to a potentiometer and omitting source 5. The potentiometer connections would be across terminals 3 and 4 with the wiper coupled to node B.

A further change in the disclosed embodiments would be to replace the NPN transistor Q1 and Q2 with PNP transistors. This change (with appropriate changes in the relative supply polarities) will enable fast limiting of positive going pulses whereas use of NPN transistors, as shown, provides fast limiting of negative going pulses.

What is claimed is:

1. Apparatus for limiting an input signal, comprising:
   a first circuit path for coupling said input signal to an output terminal (2) via the base emitter path of a first transistor (Q1);
   a second circuit path for coupling a threshold signal (Vt), provided by a threshold signal source (5), to the output terminal via the base emitter path of a second transistor (Q2);
   a third circuit path (3) for directly applying a supply voltage (+Vcc) to the collector electrodes of the first and second transistors for maintaining said electrodes at a constant DC potential;
   a fourth circuit path for coupling the output terminal (2) to a source of reference potential (4) via a first resistor (Re) and to a collector electrode of said second transistor via a second resistor (Rd); and
   a fifth circuit path for coupling a capacitor (C1) in parallel with the base and collector electrodes of said second transistor (Q2) and wherein:
   said second circuit path and said fourth circuit path are selected to exhibit an impedance inequality in which Re>Rd>Ro wherein Re and Rd are the values of the first and second resistors, respectively, and Ro is the output impedance of said threshold signal source.

2. A pulse limiter, comprising:
   first and second bipolar transistors having collector electrodes directly connected, without intervening elements, to a supply terminal, having emitter electrodes directly connected, without intervening elements, to an output terminal and coupled to a source of reference potential via a first resistor;
   a threshold voltage source connected to the base of said second transistor;
   a capacitor directly coupled between the collector and base electrodes of said second transistor;
   a second resistor coupled between the base electrode and the emitter electrode of said second transistor; and wherein:
   said first resistor is of a value greater than that of said second resistor;
   said threshold voltage source exhibits a given output impedance; and
   said second resistor is of a value greater than said given output impedance of said threshold voltage source.

3. The pulse limiter as recited in claim 2 wherein:
   said capacitor is selected to be substantially greater in value than the total capacitance, including strays, between the base and emitter electrodes of said second transistor.

4. The pulse limiter as recited in claim 2 wherein said threshold voltage source comprises:

third and fourth resistors coupled between the base electrode of said second transistor and respective ones of said supply terminal and said source of reference potential; and said third resistor exhibits a resistance selected to be less than the value of said second resistor.

5. The pulse limiter as recited in claim 2 wherein said first and second transistors, said first and second resistors, said threshold voltage source and said capacitor are formed in an integrated circuit.

6. Apparatus for limiting an input signal, comprising:

a first circuit path for coupling said input signal to an output terminal via the base emitter path of a first transistor;

a second circuit path for coupling a threshold signal to the output terminal via the base emitter path of a second transistor;

a third circuit path for directly applying a supply voltage to the collector electrodes of the first and second transistors for maintaining said electrodes at a constant DC potential;

a fourth circuit path for coupling the output terminal to a source of reference potential via a first resistor and to a collector electrode of said second transistor via a second resistor;

a fifth circuit path for coupling a capacitor in parallel with the base and collector electrodes of said second transistor; and wherein:

said second circuit path and said fourth circuit path are selected to exhibit an impedance inequality in which Re>Rd>Ro wherein Re and Rd are the values of the first and second resistors, respectively, and Ro is the output impedance of the threshold signal source.

7. A pulse limiter, comprising:

first and second bipolar transistors having collector electrodes directly connected, without intervening elements, to a supply terminal, having emitter electrodes directly connected, without intervening elements, to an output terminal and coupled to a source of reference potential via a first resistor;

a threshold voltage source connected to the base of said second transistor;

a capacitor directly coupled between the collector and base electrodes of said second transistor; and a second resistor coupled between the collector and emitter electrodes of said second transistor; and wherein:

said first resistor is of a value greater than that of said second resistor;

said threshold voltage source exhibits a given output impedance; and said second resistor is of a value greater than said given output impedance of said threshold voltage source.

8. The pulse limiter as recited in claim 7 wherein:

said capacitor is selected to be substantially greater in value than the total capacitance, including strays, between the base and emitter electrodes of said second transistor.

9. The pulse limiter as recited in claim 7 wherein said threshold voltage source comprises:

third and fourth resistors coupled between the base electrode of said second transistor and respective ones of said supply terminal and said source of reference potential; and said third resistor exhibits a resistance selected to be less than the value of said second resistor.

10. The pulse limiter as recited in claim 7 wherein said first and second transistors, said first and second resistors, said threshold voltage source and said capacitor are formed in an integrated circuit.

* * * * *